United States Patent
Wabiszczewicz

(10) Patent No.: US 7,248,471 B2
(45) Date of Patent: Jul. 24, 2007

(54) PCB WITH FORCED AIRFLOW AND DEVICE PROVIDED WITH PCB WITH FORCED AIRFLOW

(75) Inventor: Zbigniew Wabiszczewicz, Zielona Gora (PL)

(73) Assignee: Advanced Digital Broadcast S.A., Grand-Saconnex (CH)

( * ) Notice: Subject to any disclaimer, the term of this patent is extended or adjusted under 35 U.S.C. 154(b) by 125 days.

(21) Appl. No.: 10/908,670

(22) Filed: May 22, 2005

(65) Prior Publication Data

US 2006/0104025 A1      May 18, 2006

(30) Foreign Application Priority Data

Nov. 15, 2004    (PL) ...................... 371162

(51) Int. Cl.
*H05K 7/20* (2006.01)

(52) U.S. Cl. .................. 361/694; 361/692; 361/695; 165/121; 454/184; 312/223.2

(58) Field of Classification Search ........... 361/687, 361/690, 694, 695, 697, 717–719, 725; 312/223.1, 312/223.2, 236; 165/80.3, 122–126; 174/252, 174/16.3; 415/177, 178, 213.1, 214.1
See application file for complete search history.

(56) References Cited

U.S. PATENT DOCUMENTS

| | | | | |
|---|---|---|---|---|
| 5,287,009 A | * | 2/1994 | Heung | 307/141 |
| 5,684,674 A | | 11/1997 | Yin | |
| 5,694,294 A | * | 12/1997 | Ohashi et al. | 361/687 |
| 6,122,168 A | | 9/2000 | Cheng | |
| 6,452,797 B1 | * | 9/2002 | Konstad | 361/695 |
| 6,519,149 B1 | * | 2/2003 | Inoue | 361/689 |
| 6,671,177 B1 | * | 12/2003 | Han | 361/719 |
| 2005/0122682 A1 | * | 6/2005 | Streit et al. | 361/695 |

FOREIGN PATENT DOCUMENTS

JP        2001111275 A  *  4/2001

* cited by examiner

*Primary Examiner*—Michael Datskovskiy
(74) *Attorney, Agent, or Firm*—Matthias Scholl

(57) ABSTRACT

A device with a PCB with forced airflow has a housing including a first panel (141) and a second panel (142). Within the housing is mounted a printed circuit board (111) with heat dissipating elements, an opening (112), a first surface (131) and a second surface (132). The first surface (131) of the printed circuit board (111) is located at a distance from the first panel (141) smaller than a distance between the second surface (132) and the second panel (142). To the printed circuit board (111) is mounted a fan (113) that covers the opening (112) and forces airflow from a space between the first surface (131) and the first panel (141) to a space adjacent the second surface (132).

18 Claims, 6 Drawing Sheets

PCB WITH FORCED AIRFLOW AND DEVICE PROVIDED WITH PCB WITH FORCED AIRFLOW

CROSS-REFERENCE TO RELATED APPLICATIONS

This application claims priority to Polish Patent Application No. P-371162, filed Nov. 15, 2004, the contents of which are incorporated herein by reference.

BACKGROUND OF THE INVENTION

1. Field of the Invention

The present invention relates to a printed circuit board with forced airflow and a device provided with a printed circuit board with forced airflow.

2. Brief Description of the Background of the Invention Including Prior Art

Cooling systems for electronic devices are under constant improvement, due to the miniaturization of electronic elements followed by increase of dissipated heat. The design of cooling systems is an especially important issue for devices with closed housings. One of the simplest cooling elements is a radiator, whose large surface dissipates heat to the surroundings. The cooling efficiency can be increased by forcing air circulation by a fan, which can be located directly on a cooled element or which forces air circulation around all elements assembled on a main printed circuit board (called motherboard) of the device.

The U.S. Pat. No. 5,684,674 "Circuit board mounting brackets with convective airflow apertures" presents a device with expansion cards in form of printed circuit boards, where one edge of every card is assembled to the housing by means of a support with openings along the edge of the board. A fan, assembled in the device at its side panel, forces circulation of air drawn from the openings in the supports. The airflow efficiently cools the expansion cards. However, it is difficult to define the direction of airflow relative to the motherboard. After flowing along the expansion cards the air is dispersed, therefore cooling of the motherboard is ineffective. Moreover, the fan located on the side panel limits the minimum height of the device to fan dimensions.

The U.S. Pat. No. 6,122,168 "Powersupply" presents a power supply unit with a blower-type fan located horizontally, with air directed via a channel to a side panel. The channel forces airflow drawn from openings in the opposite side panel. Such solution makes it possible to lower the height of the device. However, drawing air via openings in the opposite panel is ineffective for a device with a large motherboard surface, where the air can be dispersed.

SUMMARY OF THE INVENTION

Purposes of the Invention

It is an object of the present invention to provide a cooling system applicable for devices with a horizontally located motherboard mounted within a housing and having a large surface, where many heat dissipating elements are assembled, which requires cooling with a stream of air.

This and other objects and advantages of the present invention will become apparent from the detailed description, which follows.

Brief Description of the Invention

In the device with a PCB with forced airflow, comprising heat dissipating elements, the PCB has a first and a second surface, where the first surface of the board is located at a distance from the first panel of the device that is smaller than the distance between the second surface and the opposite panel of the device, and moreover the PCB has an opening, on top of which there is a fan mounted, whose inlet covers the opening and which forces airflow from the space between the first surface of the PCB and the panel of the device towards the second PCB surface.

There can be openings in the panels of the device, via which the air gets flows from outside.

Preferably, the first surface of the PCB is directed towards the panel of the housing, in which there are openings, through which the air flows from outside to the device.

The openings can be located close to the edge of the PCB and can be located in the panels of the device, located at a certain angle to the board.

The heat dissipating elements can be located on the surface opposite to the surface on which the fan is located.

The fan can be located in the geometrical center of the board, and moreover its location can depend on the location of heat dissipating elements.

The location of openings can depend on the location of the heat dissipating elements.

Preferably, on the PCB surface opposite to the surface on which the fan is located, there are channels shaped, which direct the flow of air stream through specific areas of the PCB.

Preferably, there are channels shaped on the panel of the housing neighboring the surface of the PCB opposite to the surface on which the fan is located. These channels direct the flow of air stream above and/or under specific areas of the PCB.

Preferably, the fan is connected to the channel carrying away the air stream from the fan, and the channel can have branches, directing the air stream outside.

The idea of the invention is also that a PCB with forced airflow, circulating among heat dissipating elements and adapted for mounting in a device, has an opening, on top of which there is a fan mounted and it has a first surface and a second surface, where the first surface of the board is located at a distance from the first panel of the device that is smaller than the distance between the second surface and the opposite panel of the device.

BRIEF DESCRIPTION OF THE DRAWINGS

In the accompanying drawings one of the possible embodiments of the present invention is shown, where.

DESCRIPTION OF INVENTION AND PREFERRED EMBODIMENT

Figure 1:
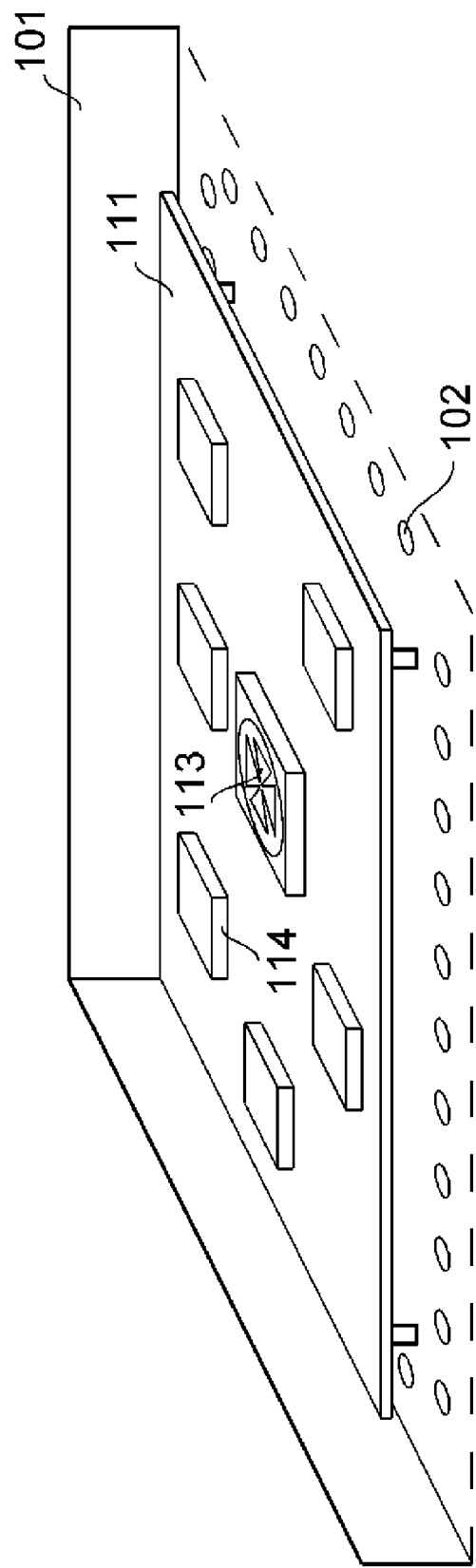
FIG. 1 shows a device with horizontally assembled printed circuit board with airflow forced underneath the board.
Figure 2:
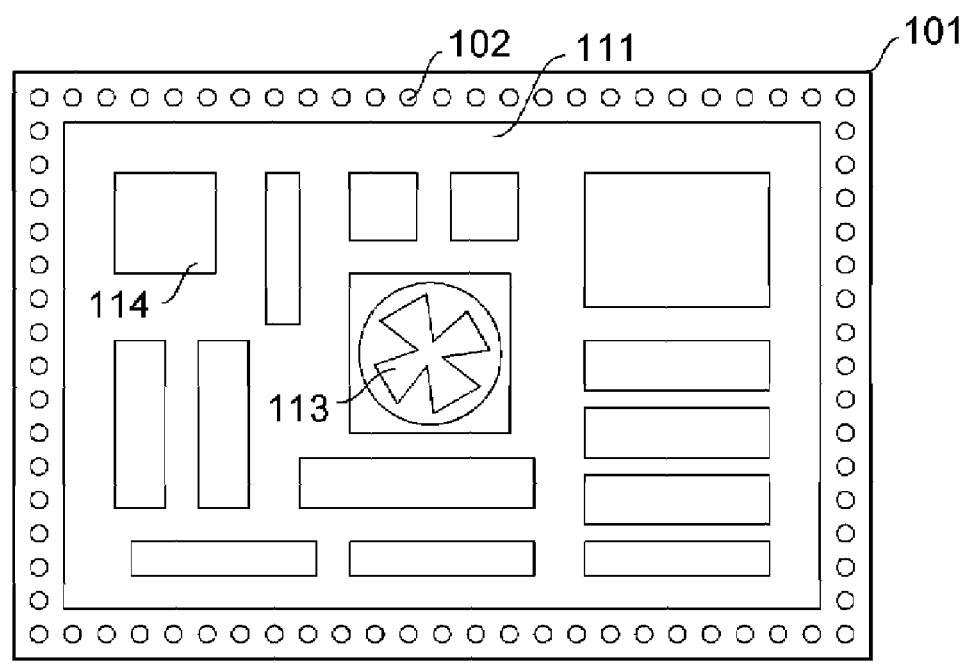
FIGS. 2, 3 and 4 show cross sections of a device with openings in bottom and side panels of housing.
Figure 3:
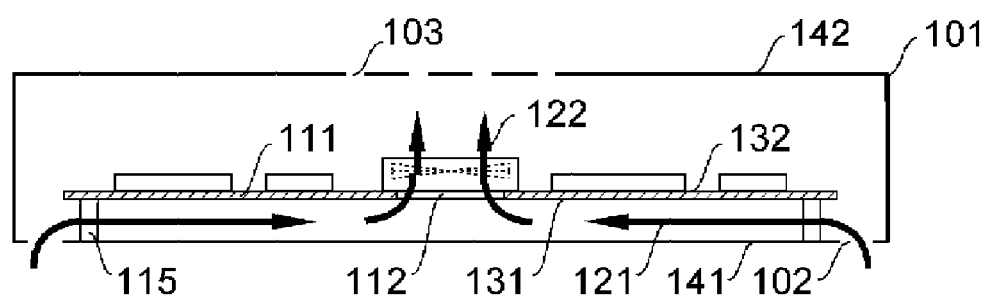

FIG. 1 shows a device 101 with horizontally assembled printed circuit board 111 with a fan 113 located on it, the top view of which is illustrated in FIG. 2, and the cross section is shown in FIG. 3. The printed circuit board 111 is mounted within a housing of the device 101 and has an opening 112 made in the PCB 101 underneath the fan 113, which is fully covered by the inlet of the fan 113.

The air is drawn in by the fan 113 from underneath the board 111 from the side of the first surface 131 via a way 121 and carried away over the board via a way 122 to the side of the second surface 132. The air underneath the board is a mixture of air, which is drawn through the openings 102 in the bottom panel of the housing and the air from above the board. The air stream, directed by the fan, can scatter over the board and escape outside through gaps in the housing or ventilation openings 103 in its top panel, or it can be carried away via a special channel shown in FIG. 8.

The essence of the presented solution is that it provides even airflow underneath the board from the side of the first surface 131. The distance of the surface 131 from the first panel of the device is smaller than the distance between the opposite panel of the device with openings 103 and the second surface 132, thanks to which it is possible to cool the lower surface of the board. Therefore, the air circulation is even and not accidental, which allows optimum selection of the fan parameters, such as dimension, power and rotational speed. The circulating air cools the bottom surface of the board and pins of elements 114 assembled on it. Airflow can be also controlled by brackets 115 with appropriate height, by means of which the board is fixed to the lower panel of housing—the lower the brackets are, the narrower the channel and the faster the airflow.

Figure 4:
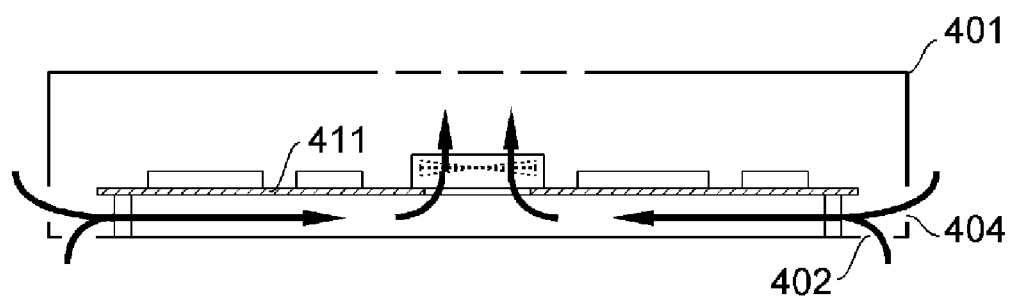

FIG. 4 presents a cross section of a device 401 with openings in the bottom 402 and side 404 panel of the housing. Such solution increases the amount of air collected from outside of the device, thanks to which the air circulating underneath the PCB is colder, which increases effectiveness of cooling.

Optionally, the lower panel of the device and the side panels can have no openings, which will cause collection of air from above the board. Such solution is also favorable, because it ensures air circulation underneath the board. In case when the PCB is in contact with the side panels of the device, there can be openings made in the board, through which air will be collected from above the board surface.

Figure 5:
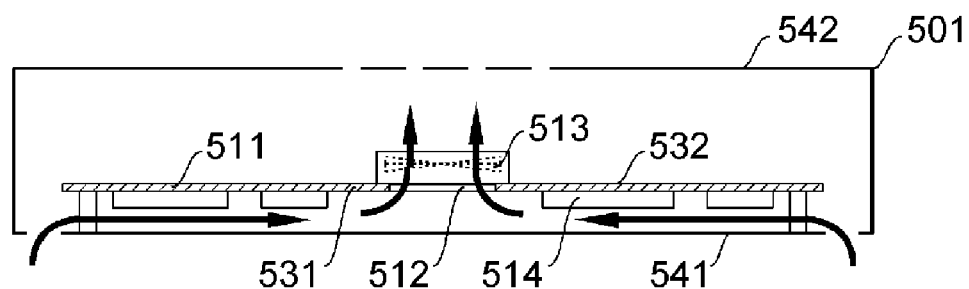
FIG. 5 shows a cross section of a device with a printed circuit board and elements fixed to a bottom surface.

FIG. 5 presents cross section of a device 501 with a printed circuit board 511 with elements 514 fixed on the bottom surface. The stream of air, drawn in by the fan 513, flowing underneath the board, not only cools its lower surface, but also directly the elements fixed to it.

Figure 6:
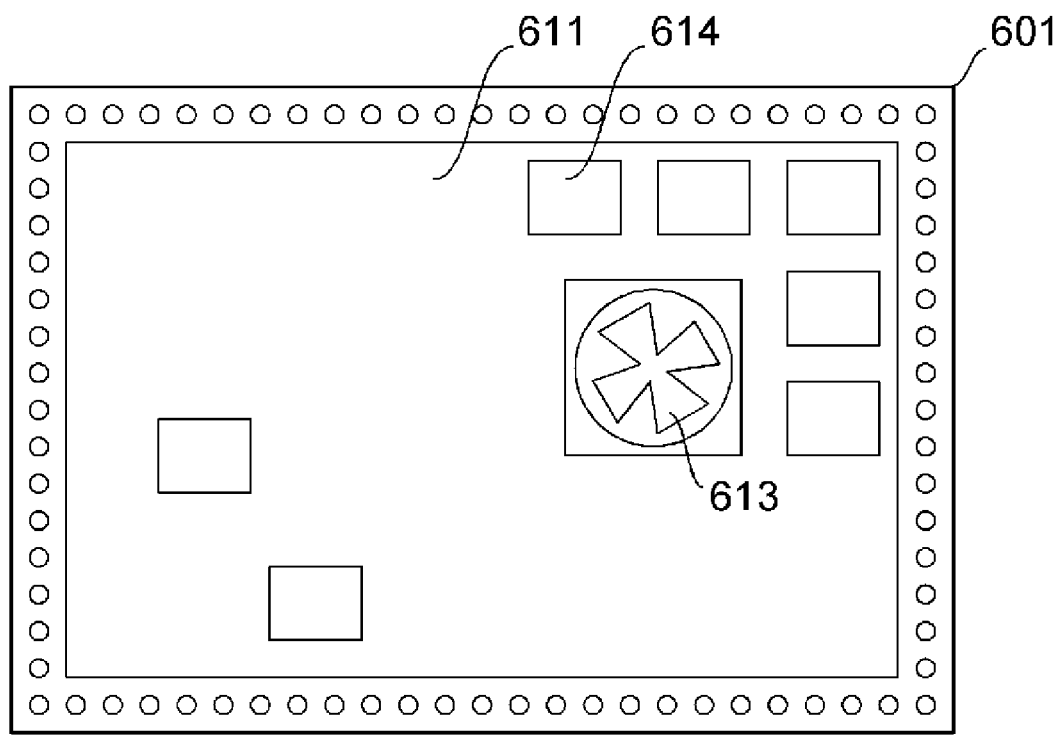
FIG. 6 shows a top view of a device with a printed circuit board with a fan, located close to heat dissipating elements.

FIG. 6 presents the top view of the device 601 with a printed circuit board 611 with a fan 613 located close to elements 614, dissipating considerable amount of heat. In the presented drawing the heat dissipating elements 614 are focused mainly in the right top part of the PCB, and therefore the location of the fan close to them causes increase of intensity of air stream flow underneath this part of the PCB.

Figure 7:
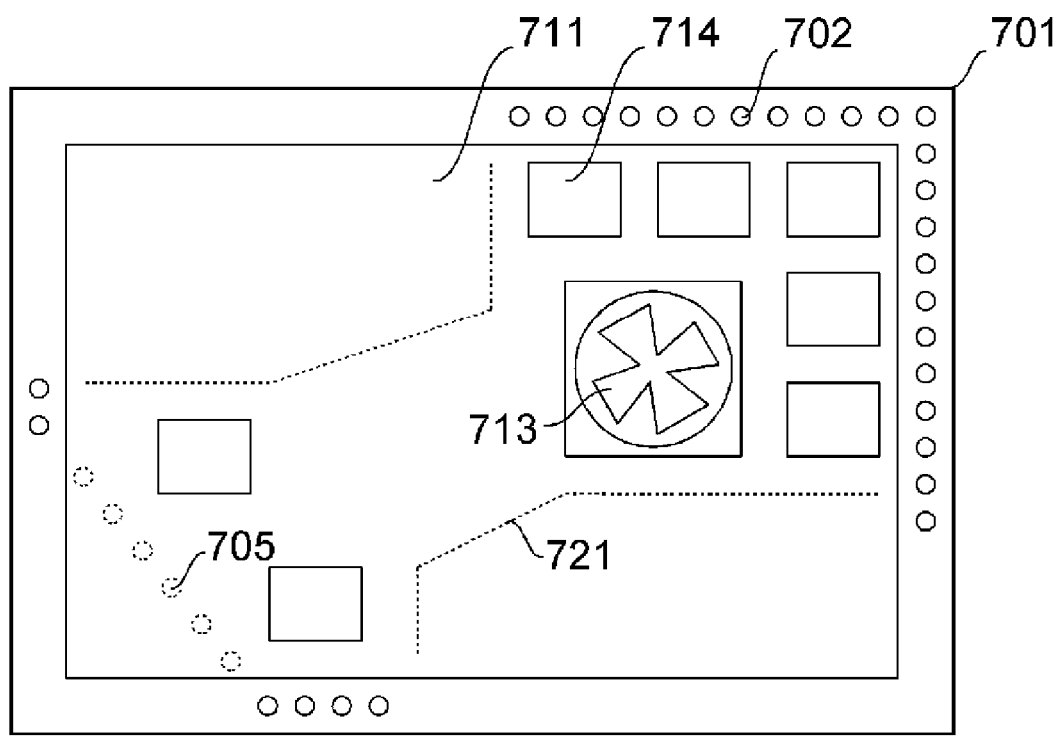
FIG. 7 shows a top view of a device with a printed circuit board with housing openings adjusted to heat dissipating elements.

FIG. 7 presents a top view of a device 701 with a printed circuit board 711 and with openings 702 in housing. The location of openings 702 was adjusted to the location of heat dissipating elements. Similarly to the solution presented in FIG. 6, the fan 713 is located close to elements 714 dissipating considerable amount of heat. In order to increase the intensity of the stream flowing underneath the heat dissipating elements, the openings 702 were located only in proximity of these elements. Moreover, in order to further increase the intensity of the stream flowing under the heat dissipating elements, the openings 705 were located away of the edge of the PCB, so that they are as close as possible to the heat dissipating elements. Moreover, in order to direct the air stream flow and limit its flow under the places in the board, which do not require intensive cooling, there were partitions applied, which create channels 721 shaped between the PCB and the lower panel of the housing. These partitions can be fixed to the PCB or a lower panel of the housing. Preferably, they are made of a flexible material (for example rubber or silicone), so that after fixing the PCB to the lower part of the housing, they create a tight channel, not letting air from other areas.

Figure 8:
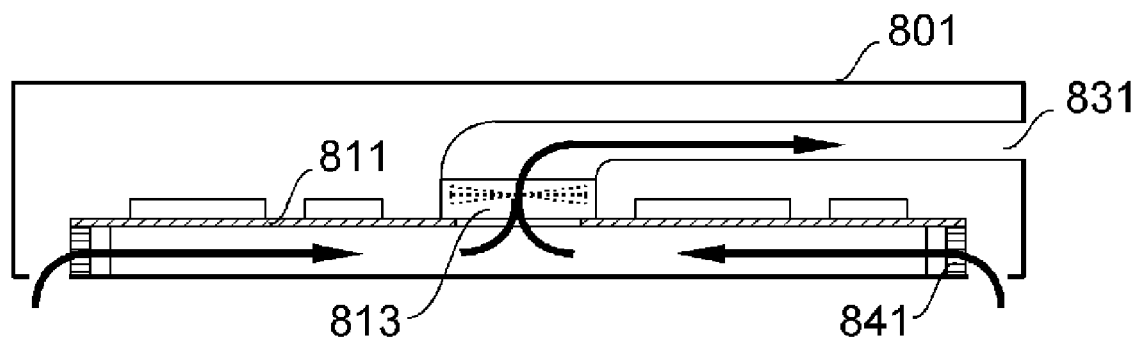
FIG. 8 shows a cross section of a device with a printed circuit board with a fan and a channel carrying away an air stream.
Figure 9:
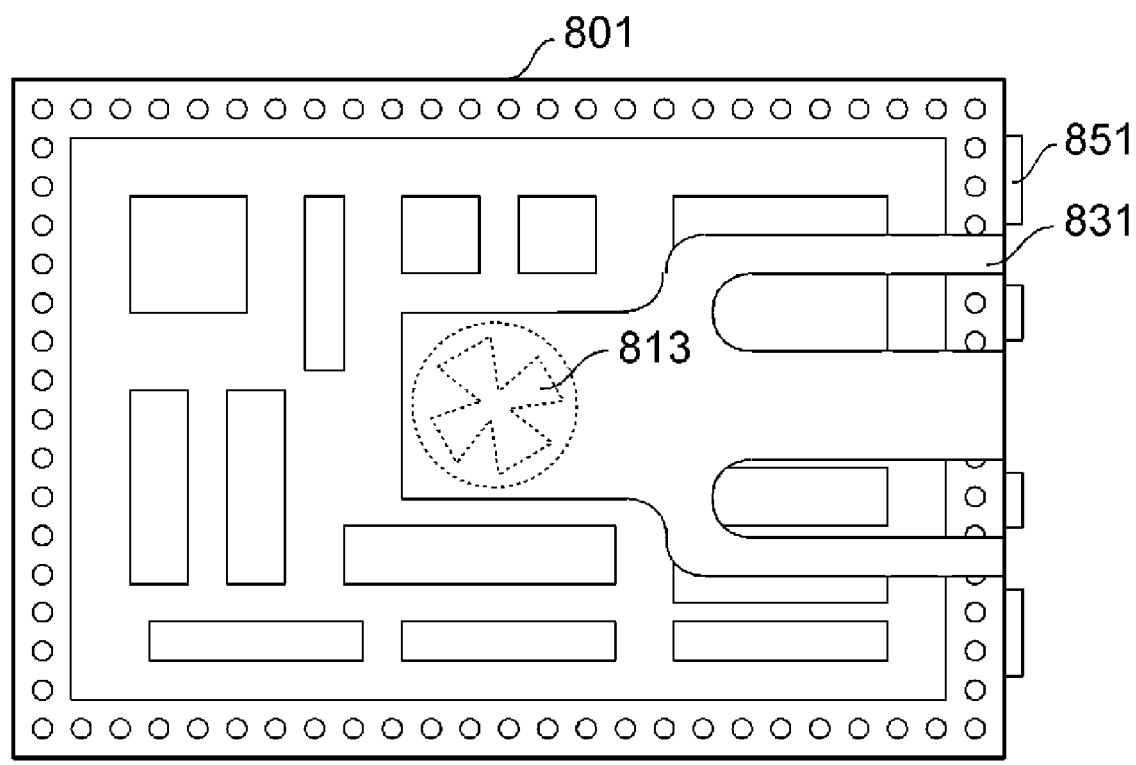
FIG. 9 shows a top view of the device of FIG. 8.

FIG. 8 shows a cross section of a device 801 with a printed circuit board 811, with a fan 813 and a channel carrying away the air stream 831, the top view of which is shown in FIG. 9. The use of channel makes it possible to carry away the air stream directly outside of the device, thanks to which the heated air is not scattered inside of the device. Preferably, the channel is directed to the rear panel of the device. If there is a large number of sockets 851 at the rear panel of the device, and the outlet of the channel should have a specific throughput, the channel can be branched and directed between the sockets. The channel can be made of a rigid material (metal, plastic) or a flexible material (rubber, silicone), which allows adjusting it precisely to the board after assembly of the device and provides tolerance of location of the outlet openings, as well as it damps mechanical vibrations of the fan, which could transferred to the PCB. The channel can be located on a typical fan from top or reach from one side the fan of the blowertype, which draws the air from the bottom, and blows it to the side.

Moreover, in case of a flexible channel, covering the fan from the top, the fan can be located directly in the channel, the end of which is pressed into the opening in the PCB. It provides a tight connection, isolates the board from vibrations and simplifies the method of fixing the fan.

There can be additionally anti-dust filters 841 applied in the device, which will decrease the quantity of dust transferred underneath the motherboard and to the fan. Smaller amounts of dust settling on the PCB and the fan prolong operation of the device. The filters 841 can be assembled in between the PCB and the lower panel of the housing of the device, as it was shown in FIG. 8, or directly on the air inlet openings, from the internal or external side of the housing, which would facilitate their exchange or cleaning.

Figure 10:
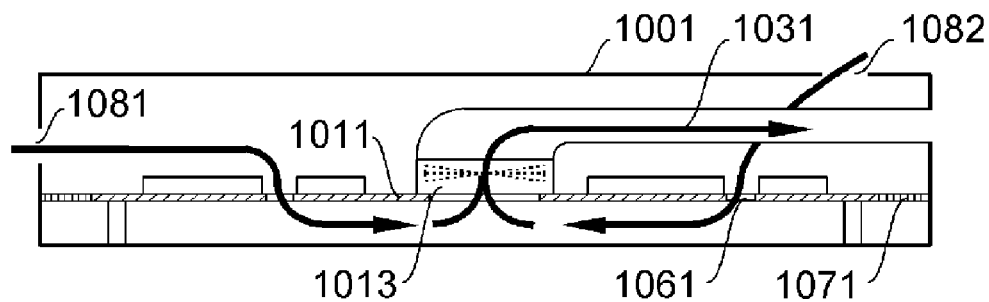
FIG. 10 shows a cross section of a device with a printed circuit board which has additionally openings for airflow.
Figure 11:
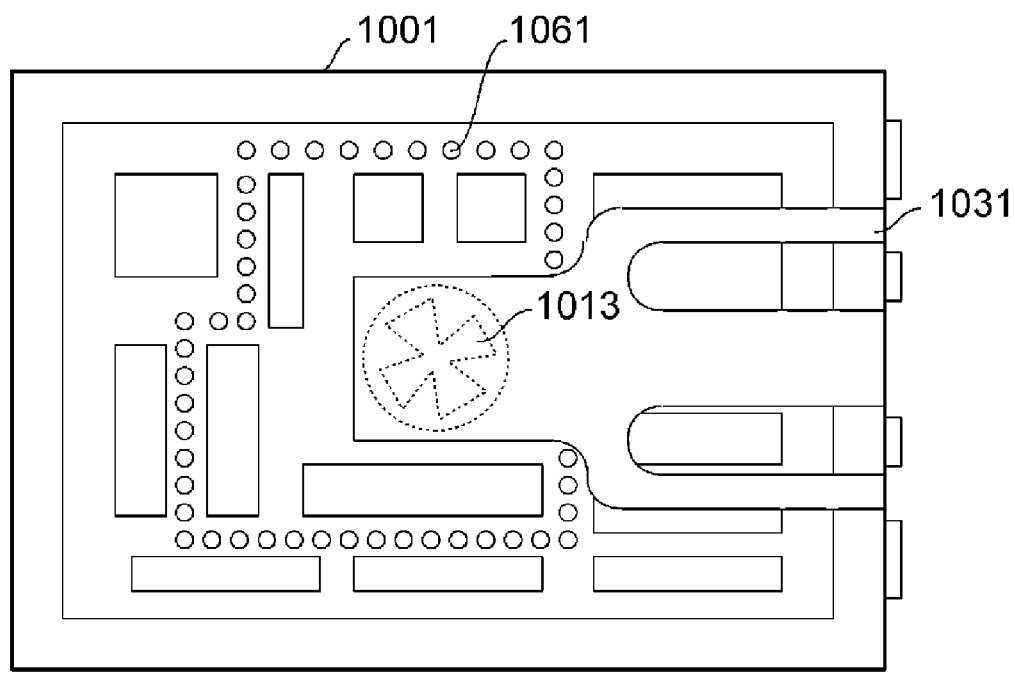
FIG. 11 shows a top view of the device of FIG. 10.

FIG. 10 shows a cross section of a device 1001 with a printed circuit board 1011, with a fan 1013, a channel carrying away the air stream 1031 and openings 1081 made in a side panel of the housing 1082, and made in a top panel of the housing, the top view of which is shown in FIG. 11. There are openings 1061 made in the PCB 1011, via which the air from above the board flows underneath the board. Such design is useful especially in devices, in which a part of heat dissipating elements is located on the top surface of the PCB, and a part on the bottom surface. At that time thanks to appropriate location of openings in the PCB and in the housing, more effective cooling of elements assembled at both sides of the board is obtained. In order to avoid circulation of air between the board and side panels of the housing, one can apply there seals 1071, made preferably of a flexible material, for example rubber.

The solution according to the invention provides efficient cooling mainly for devices with a motherboard assembled horizontally over the lower panel of the housing, where an even flow of the air stream can be achieved underneath the board. For example, these can be digital television decoders (also called set-top boxes), DVD players, portable computers (notebooks, laptops) or industrial power supply units.

The advantage of the presented solutions is that the printed circuit board is located close to one of the panels of the device (vertically or horizontally), and the fan draws the air from the area between the board and the panel of the device and blows it to the opposite side of the board. Moreover, it is generally preferable for the heat dissipating elements to be assembled on the surface neighboring with the panel of the device.

The preferred embodiment having been thus described, it will now be evident to those skilled in the art that further variation thereto may be contemplated. Such variations are not regarded as a departure from the invention, the true scope of the invention being set forth in the claims appended hereto.

What is claimed is:

1. A device with a PCB with forced airflow comprising
   a housing including a first panel with openings allowing air to flow from outside, and a second panel;
   a printed circuit board mounted within the housing and having heat dissipating elements, an opening, a first surface and a second surface, wherein the first surface is located at a distance from the first panel smaller than a distance between the second surface and the second panel; and
   a fan mounted to the printed circuit board and covering the opening wherein the fan forces airflow from a space between the first surface and the first panel to a space adjacent the second surface.

2. The device according to claim 1, wherein the first surface is directed towards the first panel.

3. The device according to claim 1, wherein the openings are located close to an edge of the printed circuit board.

4. The device according to claim 1, wherein additional openings are located in a panel situated at an angle to the board.

5. The device according to claim 1, wherein the heat dissipating elements are located on the first surface opposite to the second surface on which the fan is located.

6. The device according to claim 1, wherein the fan is located in the geometrical center of the board.

7. The device according to claim 1, wherein location of the fan depends on location of the heat dissipating elements.

8. The device according to claim 1, wherein location of openings in the housing depends on location of the heat dissipating elements.

9. The device according to claim 1, wherein on the printed circuit board surface opposite to the surface on which the fan is placed, there are channels shaped, which direct an air flow through assigned areas of the printed circuit board.

10. The device according to claim 1, wherein on the panel of the housing neighboring with the surface of the printed circuit board opposite to the surface on which the fan is located, there are channels shaped directing the air flow above and/or under specific areas of the printed circuit board.

11. The device according to claim 1, wherein the fan is connected to the channel carrying away air from the fan.

12. The device according to claim 11, wherein the channel has branches, directing air outside.

13. A printed circuit board with forced airflow comprising
    a printed circuit board with an opening and capable for mounting in a housing having a first panel with openings allowing air to flow from outside;
    heat dissipating elements mounted to the printed circuit board; and
    a fan mounted to the printed circuit board and covering the opening wherein the fan forces airflow from the outside of the housing and a space between a first surface and the first panel to a space adjacent a second surface and a house second panel.

14. The printed circuit board according to claim 13, wherein the heat dissipating elements are located on a surface opposite to a surface on which the fan is located.

15. The printed circuit board (PCB) according to claim 13, wherein the fan is located in a geometrical center of the printed circuit board.

16. The printed circuit board according to claim 13, wherein the location of the fan depends on location of heat dissipating elements.

17. The printed circuit board according to claim 13, wherein on a surface opposite to a surface on which the fan is located, there are channels shaped, directing flow of air stream through specific areas of the printed circuit board.

18. The printed circuit board according to claim 13, wherein the fan (813) is connected to a channel that carries away a stream of air from the fan.

* * * * *